(12) United States Patent
Lin et al.

(10) Patent No.: US 12,400,687 B2
(45) Date of Patent: Aug. 26, 2025

(54) SEMICONDUCTOR DIE HAVING ON-DIE POWER SWITCH FOR SELECTING TARGET OPERATION VOLTAGE FROM OPERATION VOLTAGES PROVIDED BY DIFFERENT POWER SOURCES

(71) Applicant: MEDIATEK INC., Hsin-Chu (TW)

(72) Inventors: Bo-Yun Lin, Hsinchu (TW); Fan-Wei Liao, Hsinchu (TW); Tai-Ying Jiang, Hsinchu (TW); Ko-Ching Su, Hsinchu (TW); Chun-Yueh Kuo, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 236 days.

(21) Appl. No.: 18/124,576

(22) Filed: Mar. 22, 2023

(65) Prior Publication Data

US 2023/0386525 A1   Nov. 30, 2023

Related U.S. Application Data

(60) Provisional application No. 63/432,040, filed on Dec. 12, 2022, provisional application No. 63/347,047, filed on May 31, 2022.

(51) Int. Cl.
*G11C 5/14* (2006.01)
*G11C 5/06* (2006.01)

(52) U.S. Cl.
CPC .............. *G11C 5/147* (2013.01); *G11C 5/06* (2013.01)

(58) Field of Classification Search
CPC ........... G11C 5/147; G11C 5/06; G11C 5/025; G06F 1/189; G06F 1/26
See application file for complete search history.

(56) References Cited

U.S. PATENT DOCUMENTS

| | | |
|---|---|---|
| 8,625,368 B2 | 1/2014 | Campbell |
| 9,001,572 B2 | 4/2015 | Choi |
| 9,171,610 B2 | 10/2015 | Choi |
| 9,214,221 B2 | 12/2015 | Yamaoka |
| 9,368,194 B2 | 6/2016 | Komatsu |
| 9,570,118 B2 | 2/2017 | Lee |
| 10,056,907 B1 | 8/2018 | Asnaashari |
| 2007/0262438 A1* | 11/2007 | Choa-Eoan .......... H03K 17/223 257/691 |
| 2009/0052246 A1 | 2/2009 | Bertin |
| 2009/0085684 A1* | 4/2009 | Guo .......................... H03L 1/02 331/176 |

(Continued)

FOREIGN PATENT DOCUMENTS

| | | |
|---|---|---|
| JP | 6815544 B2 | 1/2021 |
| TW | 201939299 A | 10/2019 |

*Primary Examiner* — Jerome Leboeuf
(74) *Attorney, Agent, or Firm* — Winston Hsu

(57) ABSTRACT

A semiconductor die includes an on-die power switch and a target device. The on-die power switch includes a plurality of power input nodes, a power output node, and a switch circuit. The power input nodes receive a plurality of operation voltages from a plurality of different power sources, respectively. The power output node outputs a target operation voltage selected from the operation voltages. The switch circuit selectively couples one of the power input nodes to the power output node. The target device operates according to the target operation voltage supplied from the on-die power switch. The on-die power switch and the target device are separate circuit blocks of the semiconductor die.

21 Claims, 6 Drawing Sheets

(56) References Cited

U.S. PATENT DOCUMENTS

| | | |
|---|---|---|
| 2011/0111705 A1 | 5/2011 | Chua-Eoan |
| 2014/0219010 A1* | 8/2014 | Yamaoka .............. G11C 11/417 |
| | | 365/154 |
| 2014/0313819 A1* | 10/2014 | Choi ........................ G11C 5/14 |
| | | 365/156 |
| 2015/0035446 A1 | 2/2015 | Yamahara |
| 2015/0036446 A1 | 2/2015 | Kenkare |
| 2016/0179122 A1 | 6/2016 | Trivedi |
| 2019/0220571 A1 | 7/2019 | Chung |
| 2023/0050338 A1* | 2/2023 | Kong ................. H03K 3/35625 |
| 2023/0131586 A1* | 4/2023 | Pedersen ............... G06F 1/3296 |
| | | 713/320 |

* cited by examiner

SEMICONDUCTOR DIE HAVING ON-DIE POWER SWITCH FOR SELECTING TARGET OPERATION VOLTAGE FROM OPERATION VOLTAGES PROVIDED BY DIFFERENT POWER SOURCES

CROSS REFERENCE TO RELATED APPLICATIONS

This application claims the benefit of U.S. Provisional Application No. 63/347,047, filed on May 31, 2022. Further, this application claims the benefit of U.S. Provisional Application No. 63/432,040, filed on Dec. 12, 2022. The contents of these applications are incorporated herein by reference.

BACKGROUND

The present invention relates to a semiconductor device, and more particularly, to a semiconductor die having an on-die power switch for selecting a target operation voltage from operation voltages provided by different power sources.

When the technology node (a.k.a. the process node) goes smaller due to advance of the semiconductor process, the operation voltage of most devices goes lower during the low performance requirement. Regarding the low performance requirement, there are some devices that still need a minimum operation voltage that is higher than the operation voltage of other devices. To lower the power consumption, a conventional solution may adopt extra power sources to meet the requirement of multiple operation voltages for any device that needs an operation voltage varying with the performance requirement and still needs a minimum operation voltage during the low performance requirement, which leads to high power source cost, high printed circuit board (PCB) layout complexity, more PCB layers, and larger PCB area.

SUMMARY

One of the objectives of the claimed invention is to provide a semiconductor die having an on-die power switch for selecting a target operation voltage from operation voltages provided by different power sources.

According to a first aspect of the present invention, an exemplary semiconductor die is disclosed. The exemplary semiconductor die includes an on-die power switch and a target device. The on-die power switch includes a plurality of power input nodes, a power output node, and a switch circuit. The power input nodes are arranged to receive a plurality of operation voltages from a plurality of different power sources, respectively. The power output node is arranged to output a target operation voltage selected from the operation voltages. The switch circuit is arranged to selectively couple one of the power input nodes to the power output node. The target device is arranged to operate according to the target operation voltage supplied from the on-die power switch. The on-die power switch and the target device are separate circuit blocks of the semiconductor die.

According to a second aspect of the present invention, an exemplary semiconductor die is disclosed. The exemplary semiconductor die includes a first device, an on-die power switch, and a target device. The first device is arranged to operate according to a first operation voltage from a first power source. The on-die power switch includes a plurality of power input nodes, a power output node, and a switch circuit. The power input nodes are arranged to receive a plurality of operation voltages from a plurality of different power sources, respectively, wherein the operation voltages include the first operation voltage. The power output node is arranged to output a target operation voltage selected from the operation voltages. The switch circuit is arranged to selectively couple one of the power input nodes to the power output node. The target device is arranged to operate according to the target operation voltage supplied from the on-die power switch.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
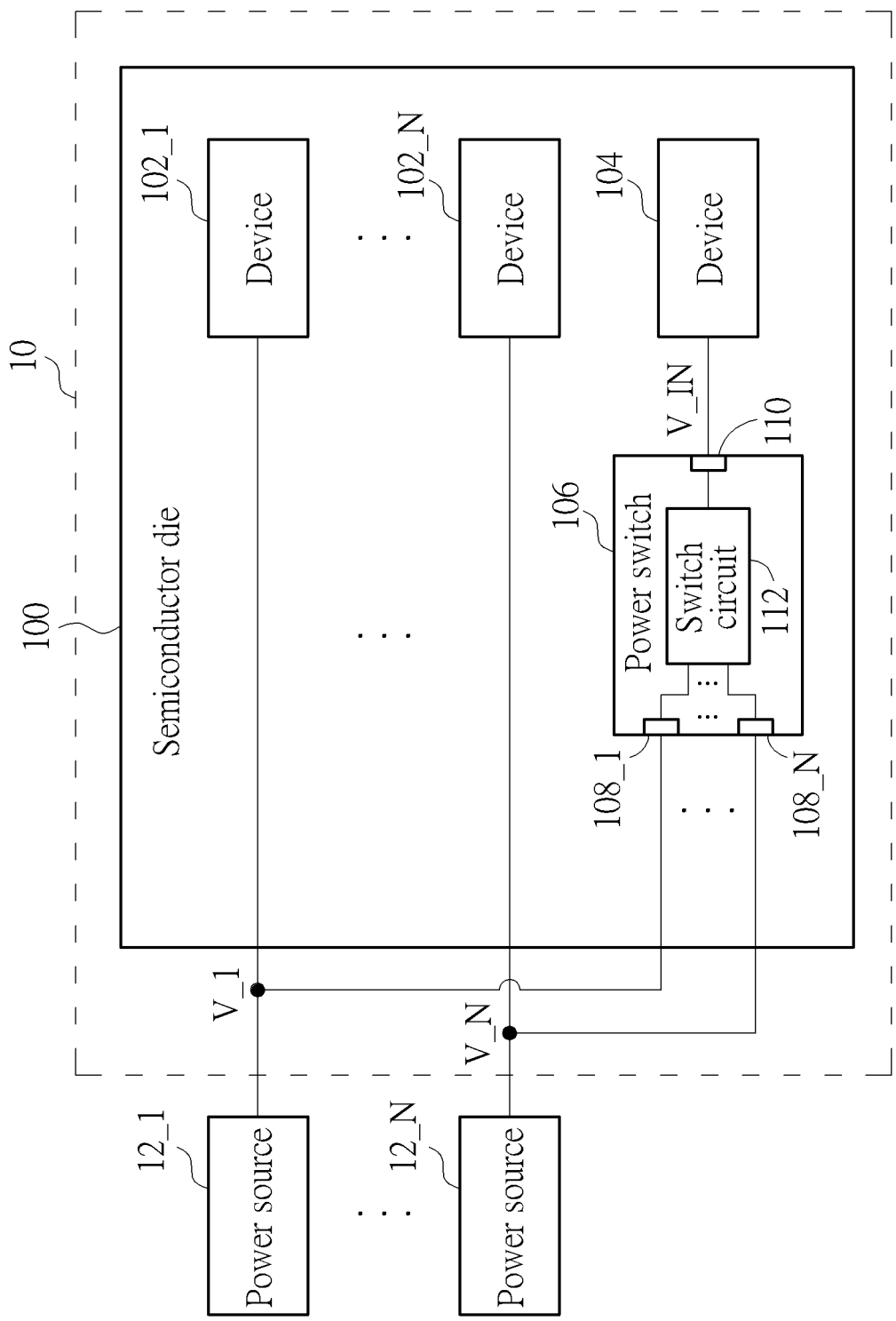
FIG. 1 is a diagram illustrating a first semiconductor die with an on-die power switch according to an embodiment of the present invention.

FIG. 1 is a diagram illustrating a first semiconductor die with an on-die power switch according to an embodiment of the present invention. The semiconductor die 100 may be a system on a chip (SoC) including a plurality of circuit designs integrated therein, where the circuit design may include one or more devices that require multiple operation voltages under different performance requirements. In this embodiment, the semiconductor die 100 includes a plurality of devices 102_1-102_N (N≥2), 104 and a power switch 106. It should be noted that only the components pertinent to the present invention are shown in FIG. 1. In practice, the semiconductor die 100 may include additional components for other designated functions. The semiconductor die 100 is packaged in a semiconductor package 10. For example, the semiconductor package 10 may be a flip-chip package. The devices 102_1-102_N (N≥2), 104 and the power switch 106 are separate circuit blocks of the semiconductor die 100. That is, the power switch 106 employs a centralized design, and is not integrated within any of the devices 102_1-102_N (N≥2), 104. The power switch 106 is an on-die power switch, and includes a plurality of power input nodes (e.g., power input pads) 108_1-108_N (N≥2), a power output node (e.g., a power output pad) 110, and a switch circuit 112. The power input nodes 108_1-108_N are arranged to receive a plurality of operation voltages V_1-V_N (N≥2) from a plurality of different power sources 12_1-12_N (N≥2), respectively. Examples of the power sources 12_1-12_N may include a buck converter, a low-dropout regulator, etc. The power output node 110 is arranged to output a target operation voltage V_IN selected from the operation voltages V_1-V_N available at the power input nodes 108_1-108_N. The switch circuit 112 is arranged to selectively couple one of the power input nodes 108_1-108_N to the power output node 110. The device 104 may need different operation voltages under different performance requirements. For example, the device 104 may be a memory device such as a static random access memory (SRAM). When the device 104 is under a high performance requirement, the device 104 may operate according to a dynamic operation voltage (e.g., V_1) that varies with the performance requirement change. When the device 104 operates under a low performance requirement, the device 104 may operate according to a fixed operation voltage (e.g., V_N) that does not vary with the performance requirement change, where the fixed operation voltage (e.g., V_N) may be a minimum operation voltage needed by the device 104 under the low performance requirement, and may be higher than the dynamic operation voltage (e.g., V_1) used by other devices under the low performance requirement.

With the help of the on-die power switch 106, the operation voltage V_1 (e.g., dynamic operation voltage) used by the device 102_1 can be shared with the device 104 that can operate according to the operation voltage V_1 under the high performance mode, and the operation voltage V_N (e.g., fixed operation voltage) used by the device 102_N can be shared with the device 104 that needs to operate according to the operation voltage V_N under the low performance mode. In this way, the number of external power sources needed by the semiconductor die (e.g., SoC) 100 can be minimized, the PCB layout complexity can be reduced, and the power performance can be maintained or enhanced. Furthermore, since the power switch 106 and the devices 102_1-102_N, 104 in the same semiconductor die 100 are fabricated by the same semiconductor process, there is no extra layout resource needed, and the power integrity (PI) simulation can be guaranteed.

A wafer bumping process may be applied to a wafer before the wafer is being diced into individual semiconductor dies. For example, bumping is essential to the flip-chip semiconductor packaging. In a case where the semiconductor package 10 is a flip-chip package, bumps are formed on one surface of the semiconductor die 100. In some embodiments of the present invention, each of the power input nodes 108_1-108_N is a power input pad with one bump formed thereon, and the power output node 110 is a power output pad with a bump formed thereon. Compared to an embedded design of a power switch with no bump out, the proposed power switch design with bump out allows easy post-silicon verification.

Figure 2:
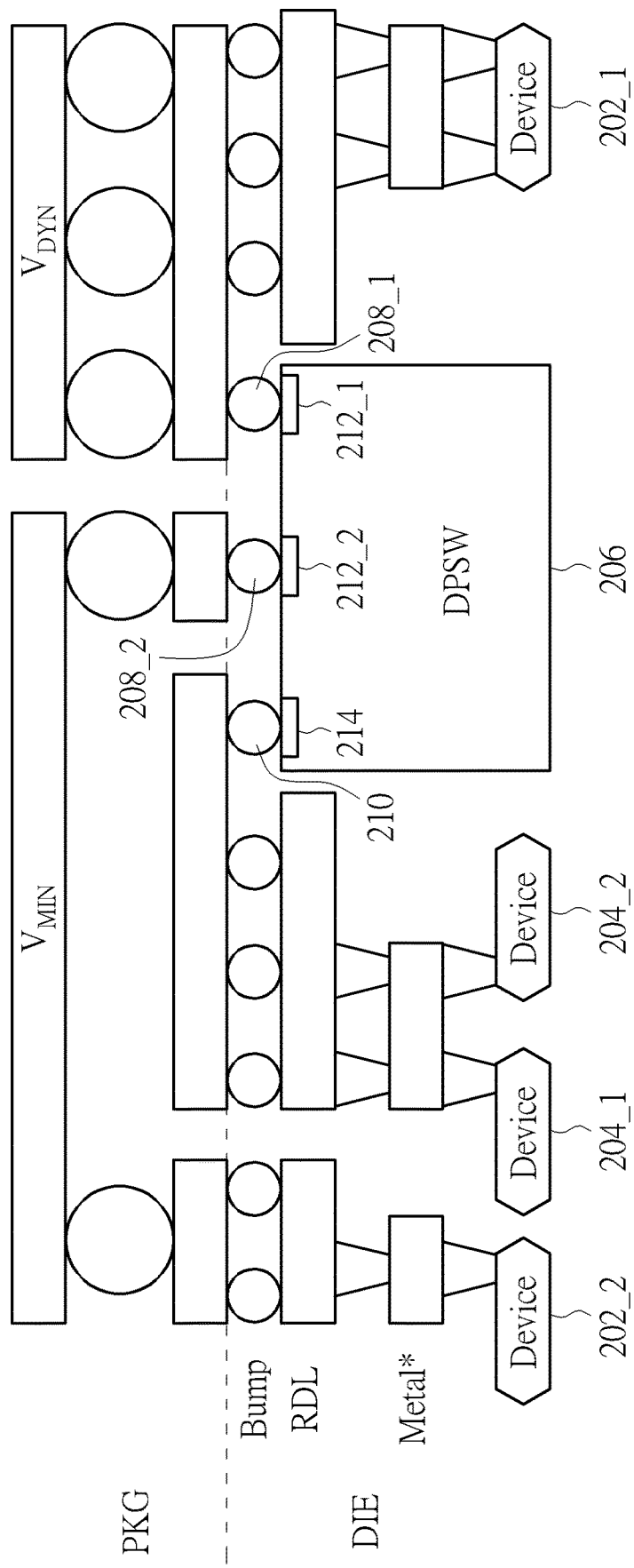
FIG. 2 is a section view of a semiconductor die with an on-die power switch according to an embodiment of the present invention.
Figure 3:
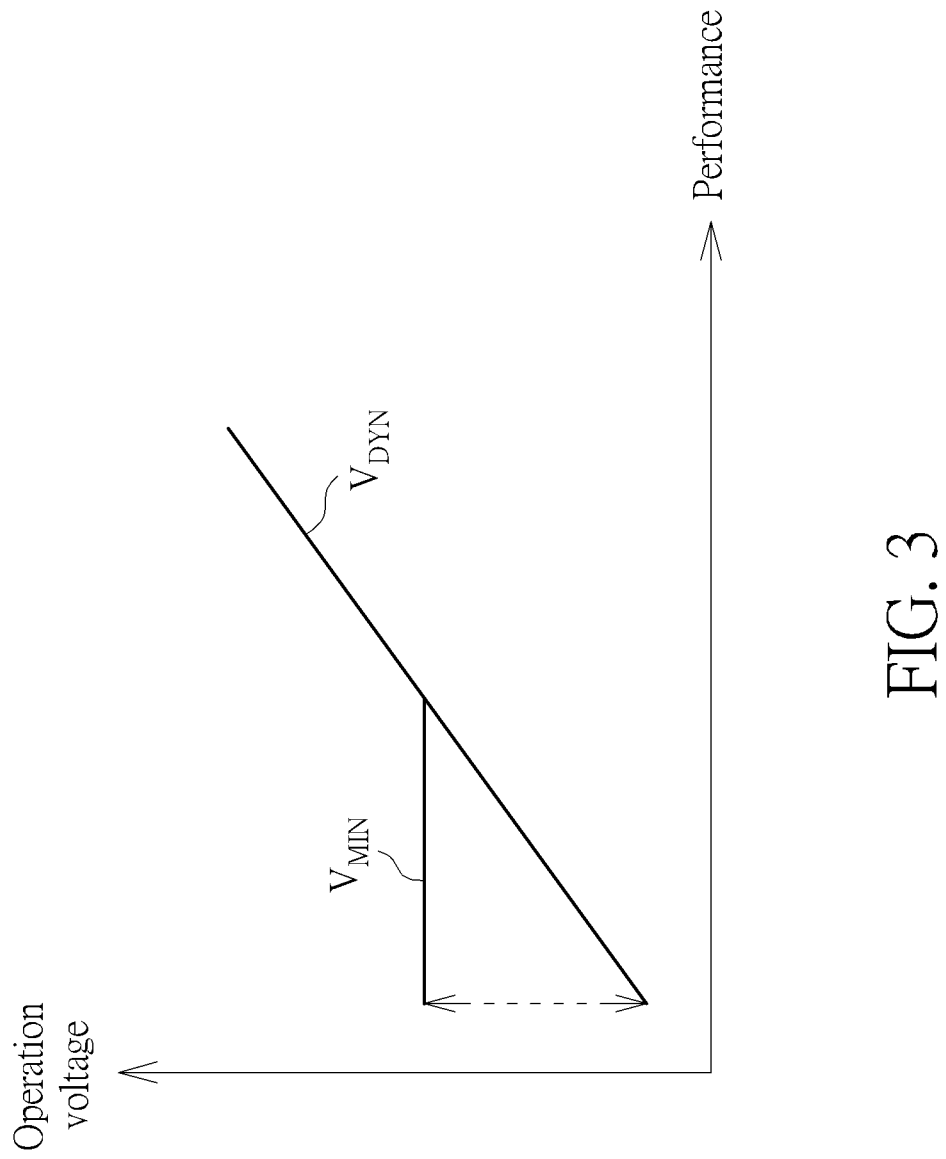
FIG. 3 is a diagram illustrating different operation voltages $V_{MIN}$, $V_{DYN}$ for different performance requirements according to an embodiment of the present invention.

FIG. 2 is a section view of a semiconductor die with an on-die power switch according to an embodiment of the present invention. For better comprehension of technical features of the present invention, it is assumed that the power switch 106 may be implemented by an on-die dual power switch (labeled by "DPSW") 206; the device 104 may be implemented by two devices 204_1 and 204_2, each being designed to operate according to a fixed operation voltage $V_{MIN}$ under a low performance requirement and operate according to a dynamic operation voltage $V_{DYN}$ under a high performance requirement, as illustrated in FIG. 3; and the devices 102_1-102_N may be implemented by devices 202_1 and 202_2. A semiconductor die (labeled by "DIE") is mounted on a PCB of a semiconductor package (labeled by "PKG"). Functions of the devices 202_1, 202_2, 204_1, 204_2 and the on-die dual-power switch 206 in the same semiconductor die are realized by circuit layouts on metal layers. In addition, bumps are formed on pads that can be properly distributed on the surface of the semiconductor die through a redistribution layer (RDL). As shown in FIG. 2, the on-die dual power switch 206 has one bump 208_1 formed on an input power pad 212_1 (which acts as one input power node of the power switch), one bump 208_2 formed on an input power pad 212_2 (which acts as another input power node of the power switch), and one bump 214 formed on an output power pad 214 (which acts as an output power node of the power switch). With a proper control of the on-die dual power switch 206 in the proximity of the target device (e.g., device 204_1/204_2), different power requirements of the target device (e.g., device 204_1/204_2) under different performance conditions can be met, without the use of additional power sources dedicated to the target device (e.g., device 204_1/204_2).

Furthermore, though the on-die dual power switch 206 is added to the semiconductor die, there is no need to modify the existing PCB layout of the semiconductor package.

Designs for retaining data under a system standby/suspend state or working for an extremely light load application will usually be placed in an always-on power domain with an operation voltage supplied from an always-on power source. The always-on power source is usually a single and unique power source in a system to achieve minimum quiescent current of regulators. In addition, the always-on power source is generally not able to do dynamic voltage scaling (DVS) since multiple circuit designs with multiple characteristics are placed in this always-on power domain. In certain cases, a circuit design may use a typical retention flip-flop which can hold its internal state when a primary power source is shut down and can have the ability to restore the state when the primary power source is brought up. The typical retention flip-flop, however, is generally designed to have two power rails, where one power rail is used to deliver an operation voltage supplied from the primary power source to a master flip-flop circuit in the retention flip-flop, and the other power rail is used to deliver an operation voltage supplied from an always-on power source to a shadow flip-flop circuit (i.e., a slave flip-flop circuit) in the same retention flip-flop. Since the master flip-flop circuit and the shadow flip-flop circuit are placed in distinct power domains, the typical retention flip-flop generally requires a level-shifter design between the master flip-flop circuit and the shadow flip-flop circuit and a power isolation design between two power rails, which results in a large die area inevitably. To address these issues, the aforementioned on-die power switch can be employed for allowing a circuit design to use a single-rail retention flip-flop with a smaller die area for retaining data under a system standby/suspend state and to have a function logic that can operate according to either a dynamic operation voltage when a non-always-on power source is turned on or an always-on operation voltage when the non-always-on power source is turned off. That is, with the help of the proposed on-die power switch, a circuit that employs DVS to save power can operate in an always-on power domain, and can employ a single-rail retention flip-flop to achieve reduction of the occupied die area. Further details are described as below with reference to the accompanying drawings.

Figure 4:
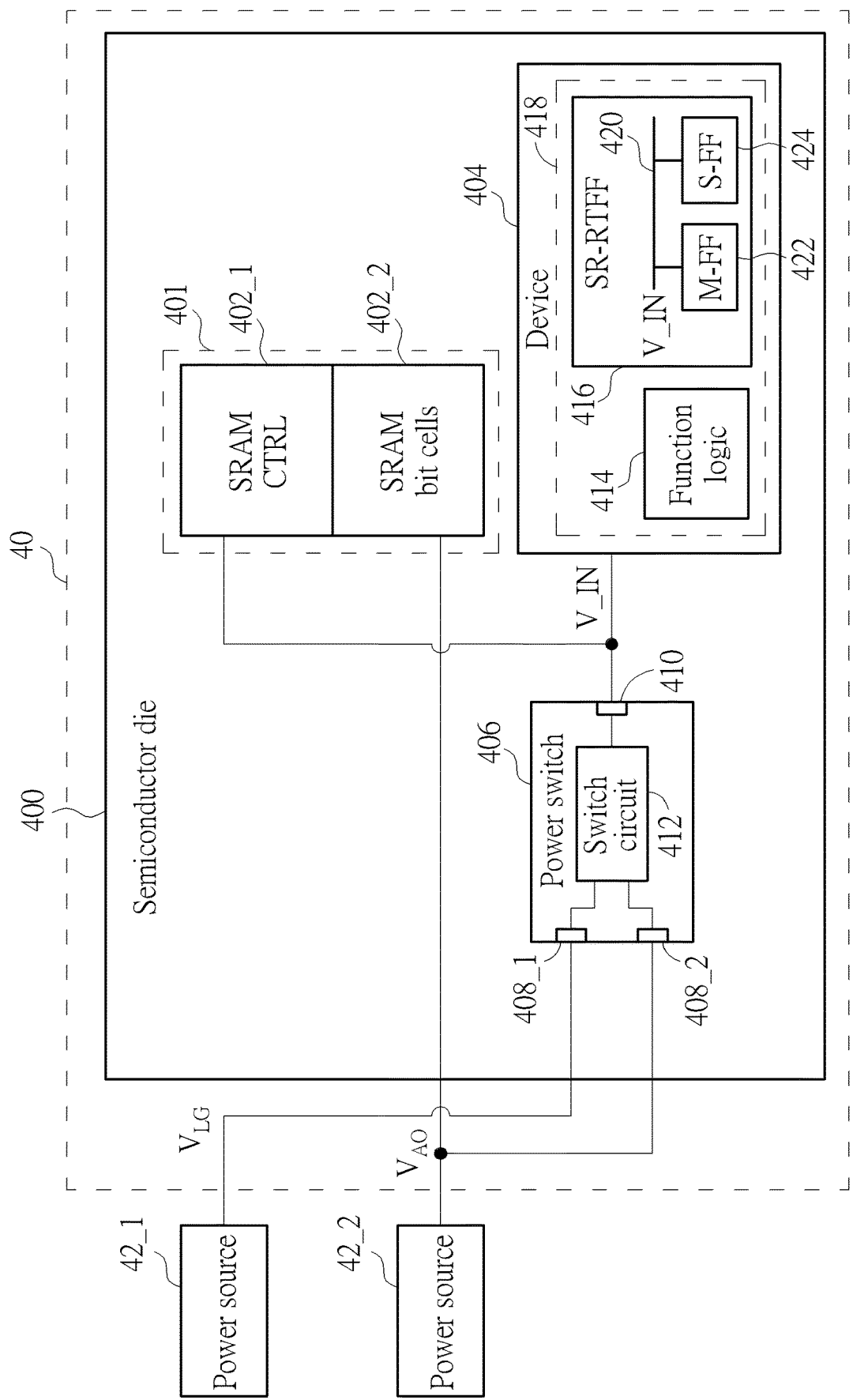
FIG. 4 is a diagram illustrating a second semiconductor die with an on-die power switch according to an embodiment of the present invention.

FIG. 4 is a diagram illustrating a second semiconductor die with an on-die power switch according to an embodiment of the present invention. The semiconductor die 400 may be an SoC including a plurality of circuit designs integrated therein, where the circuit design may include one or more devices that require multiple operation voltages under different operation states such as a normal state or a power saving state (e.g., standby/suspend state). In this embodiment, the semiconductor die 400 includes a plurality of devices 402_1, 402_2, 404 and a power switch 406. It should be noted that only the components pertinent to the present invention are shown in FIG. 4. In practice, the semiconductor die 400 may include additional components for other designated functions.

The devices 402_1 and 402_2 act as an SRAM module, where the device 402_1 is an SRAM control circuit (labeled by "SRAM CTRL"), and the device 402_2 includes SRAM bit cells. The device 404 is arranged to perform a designated function, and includes a function logic 414, a single-rail retention flip-flop (labeled by "SR-RTFF") 416, and a power electronic circuit 418. The single-rail retention flip-flop 416 includes a power rail 420, a master flip-flop circuit (labeled by "M-FF") 422 and a shadow flip-flop circuit (labeled by "S-FF") 424, where the power rail 420 is arranged to deliver a target operation voltage V_IN selected and output from the power switch 406, and is accessible to both of the master flip-flop circuit 422 and the shadow flip-flop circuit 424. That is, supply voltages of both of the master flip-flop circuit 422 and the shadow flip-flop circuit 424 are obtained from the same power rail 420. The power electronic circuit 418 may be implemented by MOS-controlled thyristors (MCTs), and can be used to control if the operation voltage V_IN is supplied to the function logic 414 and the master flip-flop circuit 422.

The semiconductor die 400 is packaged in a semiconductor package 40. For example, the semiconductor package 40 may be a flip-chip package. The devices 402_1, 402_2 (i.e., SRAM control circuit and SRAM bit cells) and the power switch 406 are separate circuit blocks of the semiconductor die 400. That is, the power switch 406 employs a centralized design, and is not integrated within any of the devices 402_1, 402_2, 404. The power switch 406 is an on-die power switch, and includes a plurality of power input nodes (e.g., power input pads) 408_1, 408_2, a power output node (e.g., a power output pad) 410, and a switch circuit 412. The power input nodes 408_1, 408_2 are arranged to receive a plurality of operation voltages $V_{LG}$ and $V_{AO}$ from a plurality of different power sources 42_1, 42_2, respectively. Examples of the power sources 42_1, 42_2 may include a buck converter, a low-dropout regulator, etc. The power output node 410 is arranged to output the target operation voltage V_IN selected from the operation voltages $V_{LG}$, $V_{AO}$ available at the power input nodes 408_1, 408_2. The switch circuit 412 is arranged to selectively couple one of the power input nodes 408_1, 408_2 to the power output node 410. For example, the power switch 406 may be implemented by the aforementioned power switch 106 or 206. Since a person skilled in the art can readily understand details of the power switch 406 after reading above paragraphs directed to the power switch 106/206, further description is omitted here for brevity.

In this embodiment, the operation voltage $V_{LG}$ may be a dynamic operation voltage provided from the power source 42_1 that supports DVS, and the operation voltage $V_{AO}$ may be an always-on voltage that is a fixed operation voltage provided from the power source 42_2. As shown in FIG. 4, the operation voltage $V_{AO}$ is provided to the device 402_2 (i.e., SRAM bit cells) of the SRAM module 401 and the power input node 408_2 of the power switch 406, and the operation voltage $V_{LG}$ is provided to the power input node 408_1 of the power switch 406.

When the device 404 operates under a normal mode, the power switch 406 (particularly, switch circuit 412 of power switch 406) selects the operation voltage $V_{LG}$ (which is a dynamic operation voltage) as the target operation voltage V_IN. Regarding the device 404, the operation voltage $V_{LG}$ is supplied to the function logic 414 and the master flip-flip circuit 422 under control of the power electronic circuit 418, and is further supplied to the shadow flip-flop circuit 424. It should be noted that, in this embodiment, both of the device (e.g., SRAM control circuit) 402_1 and the device 404 operate according to the same target operation voltage V_IN selected and output from the power switch 406.

When the device 404 operates under a power saving mode, the power switch 406 (particularly, switch circuit 412 of power switch 406) selects the operation voltage $V_{AO}$ (which is a fixed operation voltage) as the target operation voltage V_IN. The power source 42_1 may be turned off to save quiescent current. Regarding the device 404, the operation voltage $V_{LG}$ is not supplied to the function logic 414 and the master flip-flip circuit 422 under control of the power electronic circuit 418, and is supplied to the shadow flip-flop circuit 424. In this way, an internal state of the single-rail retention flip-flop 416 (particularly, an internal state of master flip-flip circuit 422) is held by the shadow flip-flop circuit 424 that is powered by the operation voltage $V_{AO}$. The same intended purpose of the typical dual-rail retention flip-flop can be achieved by using the proposed single-rail retention flip-flop 416. Compared to the typical dual-rail retention flip-flop, the proposed single-rail retention flip-flop 416 does not require a level-shifter design between the master flip-flop circuit 422 and the shadow flip-flop circuit 424 due to the fact that both of the master flip-flop circuit 422 and the shadow flip-flop circuit 424 drain required power from the same power rail 420, and does not require a power isolation design between two power rails due to the fact that there is only a single power rail 420. Hence, the proposed single-rail retention flip-flop 416 occupies a much smaller die area compared to the typical dual-rail retention flip-flop.

It should be noted that, when the power switch 406 (particularly, switch circuit 412 of power switch 406) selects the operation voltage $V_{AO}$ (which is a fixed operation voltage) as the target operation voltage V_IN, the target operation voltage V_IN is delivered via the power rail 420 of the single-rail retention flip-flop 416, and is accessible to the master flip-flop circuit 422 through the power electronic circuit 418. In other words, when the power electronic circuit 418 turns on a path between the power rail 420 and the master flip-flop circuit 422, the master flip-flop circuit 422 is allowed to operate in the always-on power domain. Similarly, when the power electronic circuit 418 turns on a path between the target operation voltage V_IN and the function logic 414, the function logic 414 is allowed operate in the always-on power domain.

Figure 5:
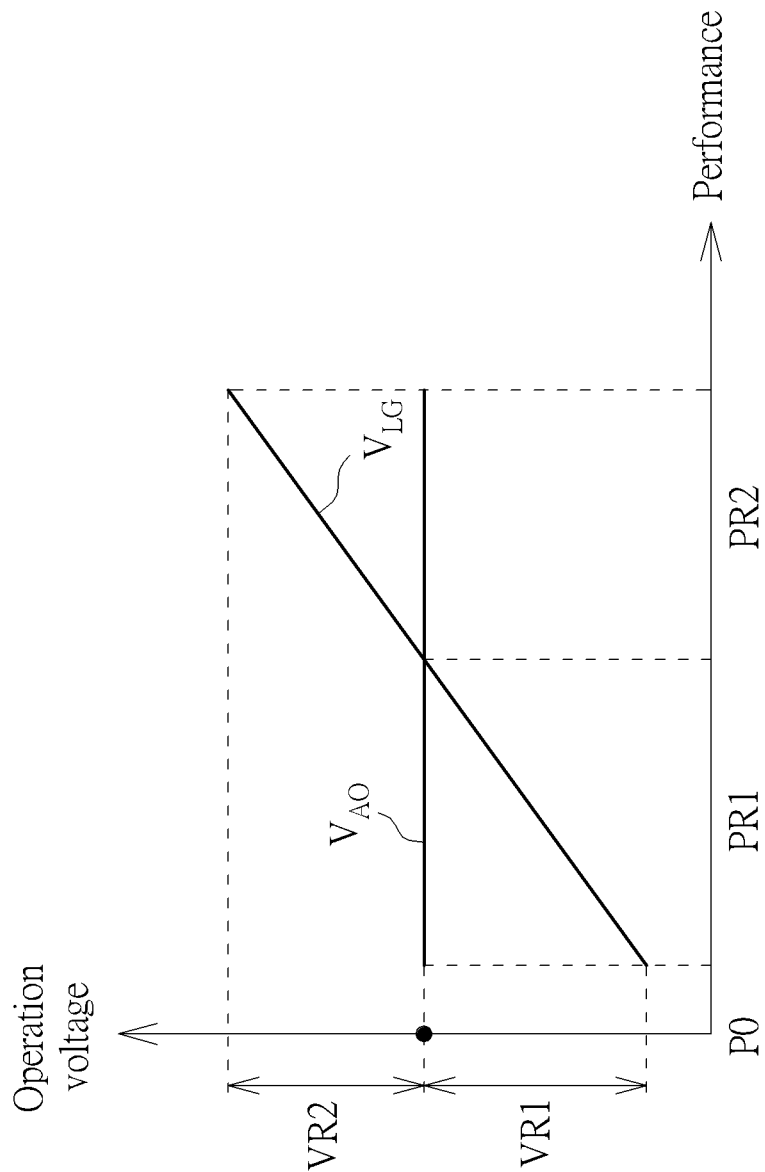
FIG. 5 is a diagram illustrating different operation voltages $V_{AO}$, $V_{LG}$ for different performance requirements according to an embodiment of the present invention.

With the help of the power switch 406 as well as the power electronic circuit 418, the device 404 can operate according to the operation voltage $V_{LA}$ (which is a dynamic operation voltage that is supplied to the function logic 414 and the master flip-flop circuit 422 through the power electronic circuit 418 and is further supplied to the shadow flip-flop circuit 424) under system normal operation, as illustrated by the voltage range VR1 and the performance range PR1 shown in FIG. 5; the device 404 can retain data according to the operation voltage $V_{AO}$ (which is an always-on voltage that is not supplied to the function logic 414 and the master flip-flop circuit 422 through the power electronic circuit 418 and is supplied to the shadow flip-flop circuit 424) under system standby operation, as illustrated by the performance index P0 shown in FIG. 5; and the device 404 can normally operate according to the operation voltage $V_{AO}$ (which is an always-on voltage that is supplied to the function logic 414 and the master flip-flop circuit 422 through the power electronic circuit 418 and is further supplied to the shadow flip-flop circuit 424), as illustrated by the performance range PR2 shown in FIG. 5.

Regarding the embodiment shown in FIG. 4, the device 402_2 (i.e., SRAM bit cells) is placed in the always-on power domain, and operates according to the operation voltage $V_{AO}$ only. However, this is for illustrative purposes only, and is not meant to be a limitation of the present invention.

Figure 6:
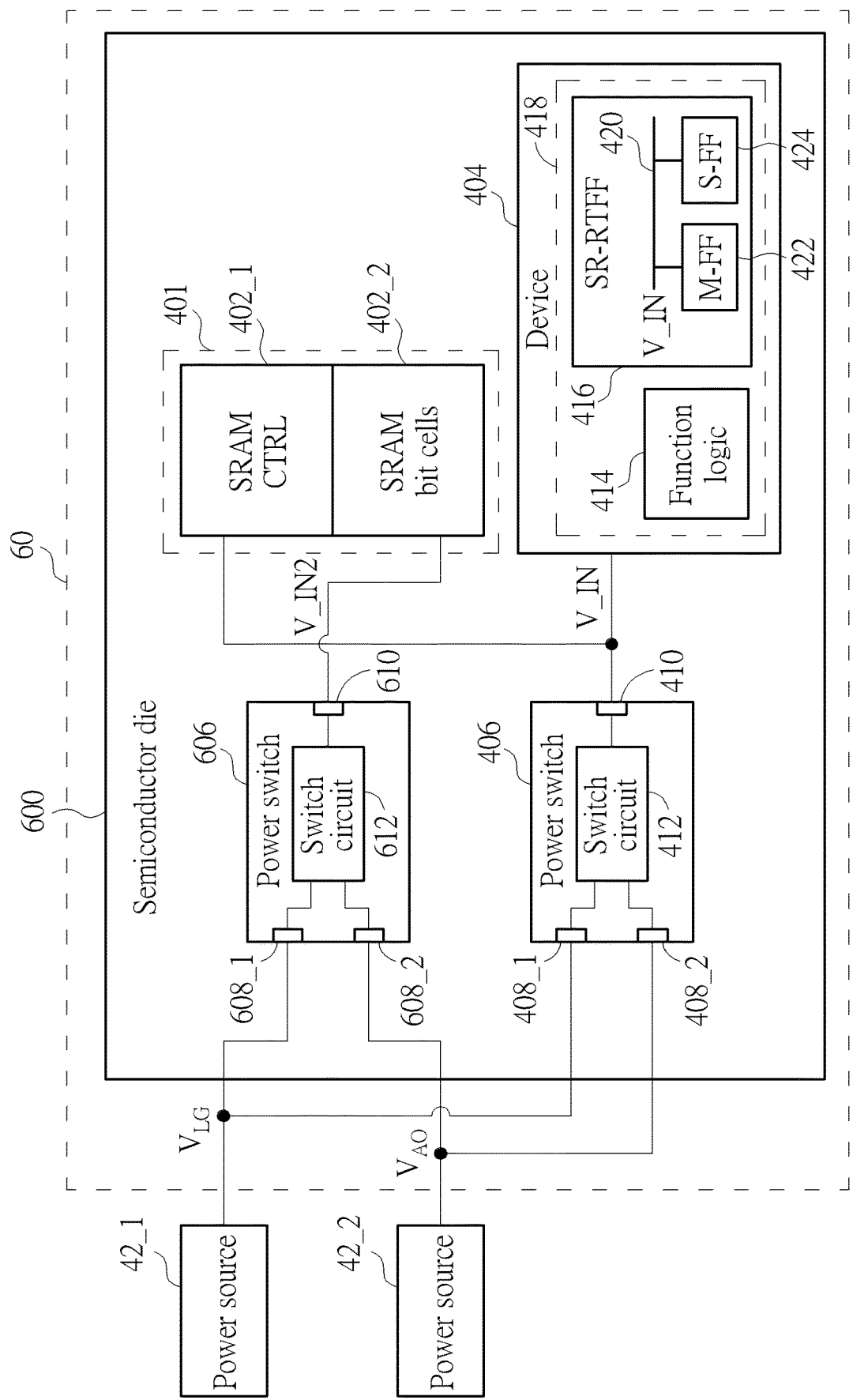
FIG. 6 is a diagram illustrating a third semiconductor die with an on-die power switch according to an embodiment of the present invention.

FIG. 6 is a diagram illustrating a third semiconductor die with an on-die power switch according to an embodiment of the present invention. The semiconductor die 600 may be an SoC including a plurality of circuit designs integrated therein, where the circuit design may include one or more devices that require multiple operation voltages under different operation states such as a normal state or a power saving state (e.g., standby/suspend state). The major difference between the semiconductor die 600 packaged in the semiconductor package 60 and the semiconductor die 400 packaged in the semiconductor package 40 is that the semiconductor die 600 further includes a power switch 606. It should be noted that only the components pertinent to the present invention are shown in FIG. 6. In practice, the semiconductor die 600 may include additional components for other designated functions.

The devices 402_1, 402_2 (i.e., SRAM control circuit and SRAM bit cells) and the power switches 406, 606 are separate circuit blocks of the semiconductor die 600. That is, each of the power switches 406, 606 employs a centralized design, and is not integrated within any of the devices 402_1, 402_2, 404. Like the power switch 406, the power switch 606 is an on-die power switch, including a plurality of power input nodes (e.g., power input pads) 608_1, 608_2, a power output node (e.g., a power output pad) 610, and a switch circuit 612. The power input nodes 608_1, 608_2 are arranged to receive operation voltages $V_{LG}$ and $V_{AO}$ from power sources 42_1, 42_2, respectively. The power output node 610 is arranged to output another target operation voltage V_IN2 selected from the operation voltages $V_{LG}$, $V_{AO}$ available at the power input nodes 608_1, 608_2, where the target operation voltage V_IN2 is supplied to the device 402_2 (i.e., SRAM: bit cells) of the SRAM module 401. The switch circuit 612 is arranged to selectively couple one of the power input nodes 608_1, 608_2 to the power output node 610. For example, the power switch 606 may be implemented by the aforementioned power switch 106 or 206. Since a person skilled in the art can readily understand details of the power switch 606 after reading above paragraphs directed to the power switch 106/206, further description is omitted here for brevity.

As mentioned above, the operation voltage $V_{LG}$ may be a dynamic operation voltage provided from the power source 42_1 that supports DVS, and the operation voltage $V_{AO}$ may be an always-on voltage that is a fixed operation voltage provided from the power source 42_2. In this embodiment, the device 402_2 (i.e., SRAM bit cells) can operate according to a fixed operation voltage (i.e., operation voltage $V_{AO}$ being an always-on voltage) under a low performance requirement, as illustrated by the performance range PR1 shown in FIG. 5; and can operate according to a dynamic operation voltage (i.e., operation voltage $V_{LG}$) under a high performance requirement, as illustrated by the voltage range VR2 and the performance range PR2 in FIG. 5. In some embodiments of the present invention, when both of the power switches 406 and 606 select the operation voltage $V_{AO}$ as the target operation voltages V_IN and VIN_IN2, the power source 42_1 may be turned off to save quiescent current. It should be noted that, in this embodiment, both of the device (e.g., SRAM control circuit) 402_1 and the device 404 operate according to the same target operation voltage V_IN selected and output from the power switch 406, and/or the target operation voltage V_IN selected and output from the power switch 406 may be the same or different from the target operation voltage V_IN2 selected and output from the power switch 606, depending upon actual application requirements.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor die comprising:
   an on-die power switch, comprising:
      a plurality of power input nodes, arranged to receive a plurality of operation voltages from a plurality of different power sources, respectively, wherein the plurality of power input nodes are a plurality of power input pads, respectively;
      a power output node, arranged to output a target operation voltage selected from the plurality of operation voltages, wherein the power output node is a power output pad; and
      a switch circuit, arranged to selectively couple one of the plurality of power input nodes to the power output node;
   a target device, arranged to operate according to the target operation voltage supplied from the on-die power switch; and
   a plurality of bumps, wherein one bump is formed on each of the plurality of power input pads and the power output pad;
   wherein the on-die power switch and the target device are separate circuit blocks of the semiconductor die.

2. The semiconductor die of claim 1, wherein the target device is a memory device.

3. The semiconductor die of claim 2, wherein the memory device is a static random access memory (SRAM).

4. The semiconductor die of claim 1, wherein one of the plurality of operation voltages is a fixed operation voltage.

5. The semiconductor die of claim 1, wherein one of the plurality of operation voltages is a dynamic operation voltage.

6. The semiconductor die of claim 1, wherein the on-die power switch has only two power input nodes.

7. A semiconductor die comprising:
an on-die power switch, comprising:
a plurality of power input nodes, arranged to receive a plurality of operation voltages from a plurality of different power sources, respectively;
a power output node, arranged to output a target operation voltage selected from the plurality of operation voltages; and
a switch circuit, arranged to selectively couple one of the plurality of power input nodes to the power output node; and
a target device, arranged to operate according to the target operation voltage supplied from the on-die power switch, wherein the on-die power switch and the target device are separate circuit blocks of the semiconductor die, one of the plurality of operation voltages is an always-on voltage, and the target device comprises:
a function logic;
a single-rail retention flip-flop, comprising:
a master flip-flop circuit;
a shadow flip-flop circuit; and
a power rail, arranged to deliver the target operation voltage supplied from the on-die power switch, wherein the power rail is accessible to both of the master flip-flop circuit and the shadow flip-flop circuit; and
a power electronic circuit, arranged to control if the target operation voltage is supplied to the function logic and the master flip-flop circuit;
wherein when the target operation voltage is the always-on voltage,
the target operation voltage is not supplied to the function logic and the master flip-flop circuit through the power electronic circuit and is supplied to the shadow flip-flop circuit; or
the target operation voltage is supplied to the function logic and the master flip-flop circuit through the power electronic circuit, and is further supplied to the shadow flip-flop circuit.

8. The semiconductor die of claim 7, wherein when the target operation voltage is not the always-on voltage, the target operation voltage is supplied to the function logic and the master flip-flop circuit through the power electronic circuit, and is further supplied to the shadow flip-flop circuit.

9. A semiconductor die comprising:
a first device, arranged to operate according to a first operation voltage from a first power source;
an on-die power switch, comprising:
a plurality of power input nodes, arranged to receive a plurality of operation voltages from a plurality of different power sources, respectively, wherein the plurality of operation voltages comprise the first operation voltage;
a power output node, arranged to output a target operation voltage selected from the plurality of operation voltages; and
a switch circuit, arranged to selectively couple one of the plurality of power input nodes to the power output node; and
a target device, arranged to operate according to the target operation voltage supplied from the on-die power switch, wherein the target device comprises:
a function logic;
a single-rail retention flip-flop, comprising:
a master flip-flop circuit;
a shadow flip-flop circuit; and
a power rail, arranged to deliver the target operation voltage supplied from the on-die power switch, wherein the power rail is accessible to both of the master flip-flop circuit and the shadow flip-flop circuit; and
a power electronic circuit, arranged to control if the target operation voltage is supplied to the function logic and the master flip-flop circuit; and
another on-die power switch, comprising:
a plurality of another power input nodes, arranged to receive the plurality of operation voltages comprising the first operation voltage;
another power output node, arranged to output another target operation voltage selected from the plurality of operation voltages; and
another switch circuit, arranged to selectively couple one of the plurality of another power input nodes to the another power output node;
wherein the first device is further arranged to operate according to the another target operation voltage supplied from the another on-die power switch.

10. The semiconductor die of claim 9, wherein the on-die power switch has only two power input nodes.

11. The semiconductor die of claim 10, further comprising:
a second device, arranged to operate according to a second operation voltage from a second power source;
wherein the plurality of operation voltages further comprise the second operation voltage.

12. The semiconductor die of claim 9, wherein the target device is a memory device.

13. The semiconductor die of claim 12, wherein the memory device is a static random access memory (SRAM).

14. The semiconductor die of claim 9, wherein the first operation voltage is a fixed operation voltage.

15. The semiconductor die of claim 9, wherein the first operation voltage is a dynamic operation voltage.

16. A semiconductor die comprising:
a first device, arranged to operate according to a first operation voltage from a first power source;
an on-die power switch, comprising:
a plurality of power input nodes, arranged to receive a plurality of operation voltages from a plurality of different power sources, respectively, wherein the plurality of operation voltages comprise the first operation voltage;
a power output node, arranged to output a target operation voltage selected from the plurality of operation voltages; and
a switch circuit, arranged to selectively couple one of the plurality of power input nodes to the power output node; and
a target device, arranged to operate according to the target operation voltage supplied from the on-die power switch, wherein the target device comprises:
a function logic;
a single-rail retention flip-flop, comprising:
a master flip-flop circuit;
a shadow flip-flop circuit; and
a power rail, arranged to deliver the target operation voltage supplied from the on-die power switch, wherein the power rail is accessible to both of the master flip-flop circuit and the shadow flip-flop circuit; and a power electronic circuit, arranged to control if the target operation voltage is supplied to the function logic and the master flip-flop circuit;

wherein when the target device operates under a power saving mode due to selection of the target operation voltage, the target operation voltage is not supplied to the function logic and the master flip-flop circuit through the power electronic circuit, and is supplied to the shadow flip-flop circuit; or the target operation voltage is supplied to the function logic and the master flip-flop circuit through the power electronic circuit, and is further supplied to the shadow flip-flop circuit.

17. The semiconductor die of claim 16, wherein the first device is a memory device.

18. The semiconductor die of claim 17, wherein the memory device is a static random access memory (SRAM).

19. The semiconductor die of claim 16, wherein the first device is further arranged to operate according to the target operation voltage supplied from the on-die power switch.

20. The semiconductor die of claim 16, further comprising:

another on-die power switch, comprising:

a plurality of another power input nodes, arranged to receive the plurality of operation voltages comprising the first operation voltage;

another power output node, arranged to output another target operation voltage selected from the plurality of operation voltages; and another switch circuit, arranged to selectively couple one of the plurality of another power input nodes to the another power output node;

wherein the first device is further arranged to operate according to the another target operation voltage supplied from the another on-die power switch.

21. The semiconductor die of claim 16, wherein when the target device operates under a normal mode due to selection of the target operation voltage, the target operation voltage is supplied to the function logic and the master flip-flop circuit through the power electronic circuit, and is further supplied to the shadow flip-flop circuit.

* * * * *